(12) United States Patent
Kamisuki

(10) Patent No.: US 9,695,041 B2
(45) Date of Patent: Jul. 4, 2017

(54) PHYSICAL QUANTITY SENSOR, METHOD FOR MANUFACTURING PHYSICAL QUANTITY SENSOR, ELECTRONIC DEVICE, AND MOVING BODY

(71) Applicant: Seiko Epson Corporation, Tokyo (JP)

(72) Inventor: Shinichi Kamisuki, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/937,108

(22) Filed: Nov. 10, 2015

(65) Prior Publication Data

US 2016/0130135 A1    May 12, 2016

(30) Foreign Application Priority Data

Nov. 12, 2014  (JP) ................. 2014-229559

(51) Int. Cl.
*H01L 21/00*  (2006.01)
*B81C 1/00*   (2006.01)

(52) U.S. Cl.
CPC ...... *B81C 1/00873* (2013.01); *B81C 1/00269* (2013.01); *B81B 2201/0235* (2013.01); *B81C 2203/019* (2013.01); *B81C 2203/0118* (2013.01); *B81C 2203/031* (2013.01)

(58) Field of Classification Search
USPC ........................................................ 438/51
See application file for complete search history.

(56) References Cited

U.S. PATENT DOCUMENTS

| 8,497,557 | B2 | 7/2013 | Tanaka et al. |
| 9,065,021 | B2* | 6/2015 | Nagata .............. H01L 33/48 |
| 2005/0227401 | A1 | 10/2005 | Lee et al. |
| 2014/0061624 | A1* | 3/2014 | Nagata .............. H01L 33/48 |
| | | | 257/40 |

FOREIGN PATENT DOCUMENTS

| JP | 2005-297180 A | 10/2005 |
| JP | 2006-339369 A | 12/2006 |
| JP | 2006339369 A * | 12/2006 |
| JP | 2010-260167 A | 11/2010 |
| JP | 2011-199301 A | 10/2011 |
| JP | 2011-245587 A | 12/2011 |

* cited by examiner

*Primary Examiner* — Telly Green
(74) *Attorney, Agent, or Firm* — Harness, Dickey & Pierce, P.L.C.

(57) ABSTRACT

A physical quantity sensor includes a supporting substrate, an acceleration detecting element that is mounted on the supporting substrate, and a sealing substrate that is bonded to the supporting substrate, and seals the acceleration detecting element, in which a notch portion is formed in a portion of a bonded face to the supporting substrate, in the sealing substrate, and a filling material that is configured by a material which is different from a material configuring the sealing substrate, is arranged in the notch portion.

8 Claims, 13 Drawing Sheets

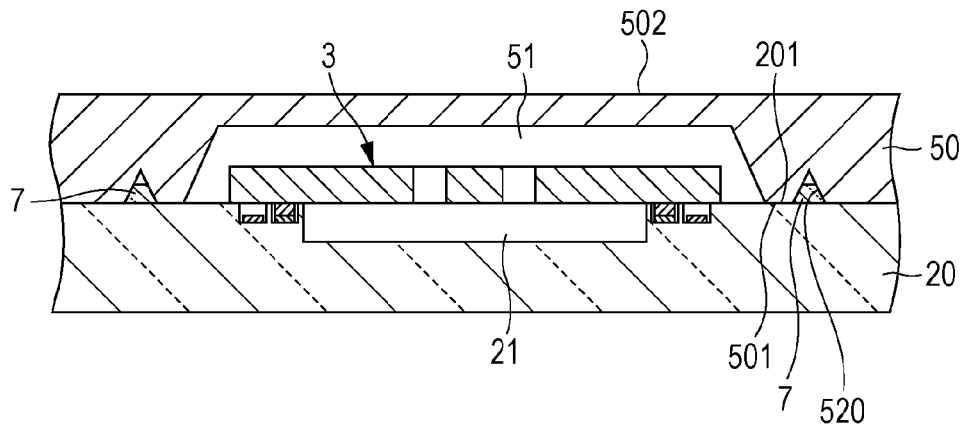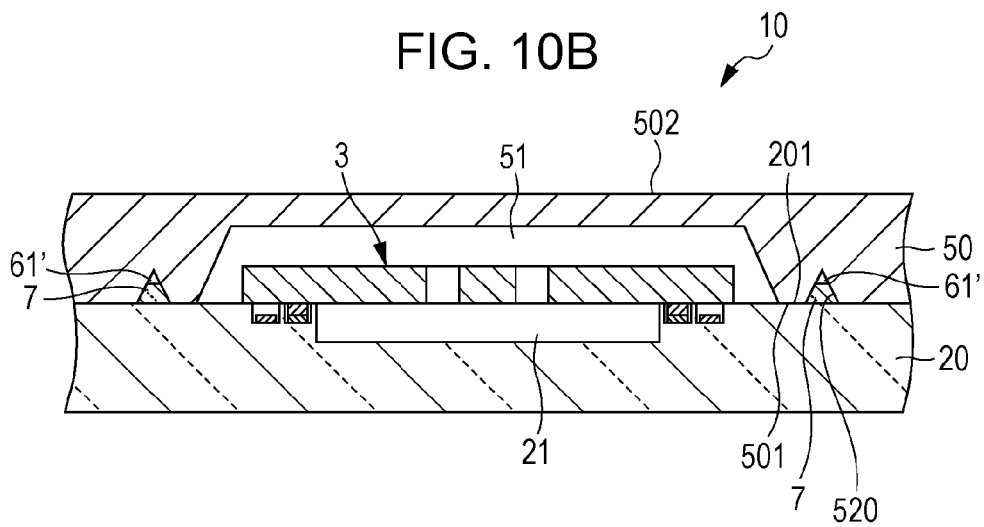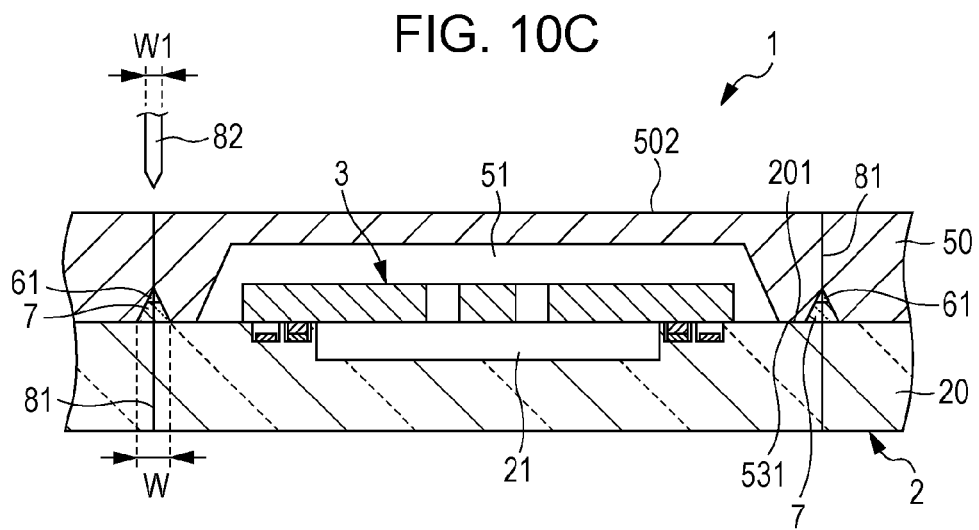

PHYSICAL QUANTITY SENSOR, METHOD FOR MANUFACTURING PHYSICAL QUANTITY SENSOR, ELECTRONIC DEVICE, AND MOVING BODY

BACKGROUND

1. Technical Field

The present invention relates to a physical quantity sensor, a method for manufacturing a physical quantity sensor, an electronic device, and a moving body.

2. Related Art

In the past, for example, a physical quantity sensor that detects a physical quantity such as an angular velocity has been developed. As such a physical quantity sensor, for example, it is possible to use a MEMS device including an element substrate, a MEMS element that is mounted on the element substrate, and a cap substrate that is bonded to the element substrate, and covers the MEMS element, as described in JP-A-2011-245587.

Moreover, it is possible to obtain such the MEMS device by mounting a plurality of MEMS elements in a raw material substrate of the element substrate, and dicing each of raw material substrates after bonding a raw material substrate of the cap substrate to a raw material substrate of the element substrate so as to cover the MEMS element. At the time of the dicing, the respective raw material substrates are cut by an etching in JP-A-2011-245587, but the respective raw material substrates are cut by using a dicing apparatus in general.

However, if the dicing is performed by using the dicing apparatus, a bonded portion of the element substrate and the cap substrate may be peeled off by an impact at the time of the dicing, in the MEMS device having a configuration of the related art. As a result, since the MEMS device where the MEMS element is not sealed by the cap substrate and the element substrate is likely to be produced, a yield of the MEMS device may be lowered, and the reliability may be lowered even in the MEMS device where the peeling does not occur.

SUMMARY

An advantage of some aspects of the invention is to provide a physical quantity sensor with high reliability where a lowering of a yield is reduced, a method for manufacturing a physical quantity sensor that can easily manufacture the physical quantity sensor, and can reduce the lowering of the yield, an electronic device including the physical quantity sensor, and a moving body including the physical quantity sensor.

The invention can be realized in the following forms or application examples.

APPLICATION EXAMPLE 1

According to this application example, there is provided a physical quantity sensor including a supporting substrate, a sensor element that is mounted on the supporting substrate, and a sealing substrate that is bonded to the supporting substrate, and seals the sensor element, in which a notch portion is formed in a portion of a bonded face of the supporting substrate and the sealing substrate, in at least one of the supporting substrate and the sealing substrate, and a filling material that is configured by a material which is different from a material configuring the sealing substrate, is arranged in the notch portion.

Accordingly, for example, by using a dicing blade, at the time of forming an outer shape of the physical quantity sensor by collectively cutting the supporting substrate and the sealing substrate at a position overlapping with the notch portion in a planar view, since the notch portion is arranged, it is possible to make the dicing blade not to hit directly on the bonded face of the supporting substrate and the sealing substrate. Thereby, it is possible to prevent an impact which is generated by the cutting from being applied to the bonded face. Moreover, it is possible to protect the notch portion by the filling material. Hence, it is possible to reduce the occurrence of the peeling of the supporting substrate and the sealing substrate. Therefore, it is possible to obtain the physical quantity sensor with high reliability where the sensor element is sealed by the supporting substrate and the sealing substrate at a high yield.

Furthermore, since the filling material is arranged in the notch portion which is arranged in the portion of the bonded face of the supporting substrate and the sealing substrate, it is possible to reinforce the bonding of the supporting substrate and the sealing substrate in the bonded face.

APPLICATION EXAMPLE 2

In the physical quantity sensor according to the application example, it is preferable that the filling material includes a low melting point glass material.

Accordingly, since the filling material functions as an adhesive material for attaching the supporting substrate and the sealing substrate, it is possible to bond the supporting substrate and the sealing substrate more firmly.

APPLICATION EXAMPLE 3

In the physical quantity sensor according to the application example, it is preferable that the sealing substrate includes a silicon material.

Accordingly, for example, when the supporting substrate is configured by a glass material, since the supporting substrate and the sealing substrate may be bonded to each other by anodic bonding, it is possible to bond the supporting substrate and the sealing substrate more firmly. Therefore, it is possible to make airtightness of a storage space which is formed by the supporting substrate and the sealing substrate higher.

APPLICATION EXAMPLE 4

In the physical quantity sensor according to the application example, it is preferable that the supporting substrate includes a glass material.

Accordingly, for example, when the sealing substrate is configured by the silicon material, since the supporting substrate and the sealing substrate may be bonded to each other by the anodic bonding, it is possible to bond the supporting substrate and the sealing substrate more firmly. Therefore, it is possible to make the airtightness of the storage space which is formed by the supporting substrate and the sealing substrate higher.

APPLICATION EXAMPLE 5

In the physical quantity sensor according to the application example, it is preferable that the notch portion is arranged on an outside to the bonded face.

In this manner, since the notch portion is arranged on the outside of the bonded face of the supporting substrate and the sealing substrate which surround the sensor element, in the planar view, for example, at the time of forming the outer shape of the physical quantity sensor by collectively cutting the supporting substrate and the sealing substrate at the position overlapping with the notch portion in the planar view by using the dicing blade, it is possible to more effectively prevent the dicing blade from hitting on the bonded face of the supporting substrate and the sealing substrate. Thereby, it is possible to further reduce the occurrence of the peeling of the supporting substrate and the sealing substrate in the bonded face, by the impact which is generated by the cutting.

APPLICATION EXAMPLE 6

In the physical quantity sensor according to the application example, it is preferable that the notch portion is formed in the sealing substrate.

Accordingly, for example, at the time of collectively cutting the supporting substrate and the sealing substrate toward the supporting substrate side from the sealing substrate side, since the notch portion is arranged on the sealing substrate side which is cut ahead, it is possible to further reduce the occurrence of the peeling of the sealing substrate and the supporting substrate in the bonded face.

APPLICATION EXAMPLE 7

According to this application example, there is provided a method for manufacturing a physical quantity sensor including preparing a sensor element, a parent material of a supporting substrate where the sensor element is arranged, and a parent material of a sealing substrate that seals the sensor element, forming a bonding body by bonding the parent material of the supporting substrate, and the parent material of the sealing substrate, and cutting the bonding body, in which a concave portion is arranged to be along a cut region, in at least one of the parent material of the supporting substrate and the parent material of the sealing substrate which are prepared in the preparing, and arranging a filling material of a material which is different from a configuration material of the sealing substrate in the concave portion is included, before the forming of the bonding body.

Accordingly, for example, by using the dicing blade, at the time of cutting the bonding body so as to overlap with the concave portion in the planar view of the bonding body, since the concave portion is arranged, it is possible to make the dicing blade not to hit directly on the bonded face. Thereby, it is possible to prevent the impact which is generated by the cutting from being applied to the bonded face. Moreover, since the filling material is arranged, it is possible to protect the notch portion which is obtained by cutting the concave portion. Hence, it is possible to reduce the occurrence of the peeling of the supporting substrate and the sealing substrate. Therefore, it is possible to obtain the physical quantity sensor with high reliability where the sensor element is sealed by the supporting substrate and the sealing substrate at a high yield.

APPLICATION EXAMPLE 8

According to this application example, there is provided an electronic device including the physical quantity sensor of the invention.

Accordingly, it is possible to provide the electronic device with high reliability.

APPLICATION EXAMPLE 9

According to this application example, there is provided a moving body including the physical quantity sensor of the invention.

Accordingly, it is possible to provide the moving body with high reliability.

BRIEF DESCRIPTION OF THE DRAWINGS

The invention will be described with reference to the accompanying drawings, wherein like numbers reference like elements.

FIG. 10A to FIG. 10C are views for illustrating the method for manufacturing the physical quantity sensor illustrated in FIG. 3.

DESCRIPTION OF EXEMPLARY EMBODIMENTS

Hereinafter, a physical quantity sensor, a method for manufacturing a physical quantity sensor, an electronic device, and a moving body of the invention will be described with reference to the accompanying drawings.

Figure 1:
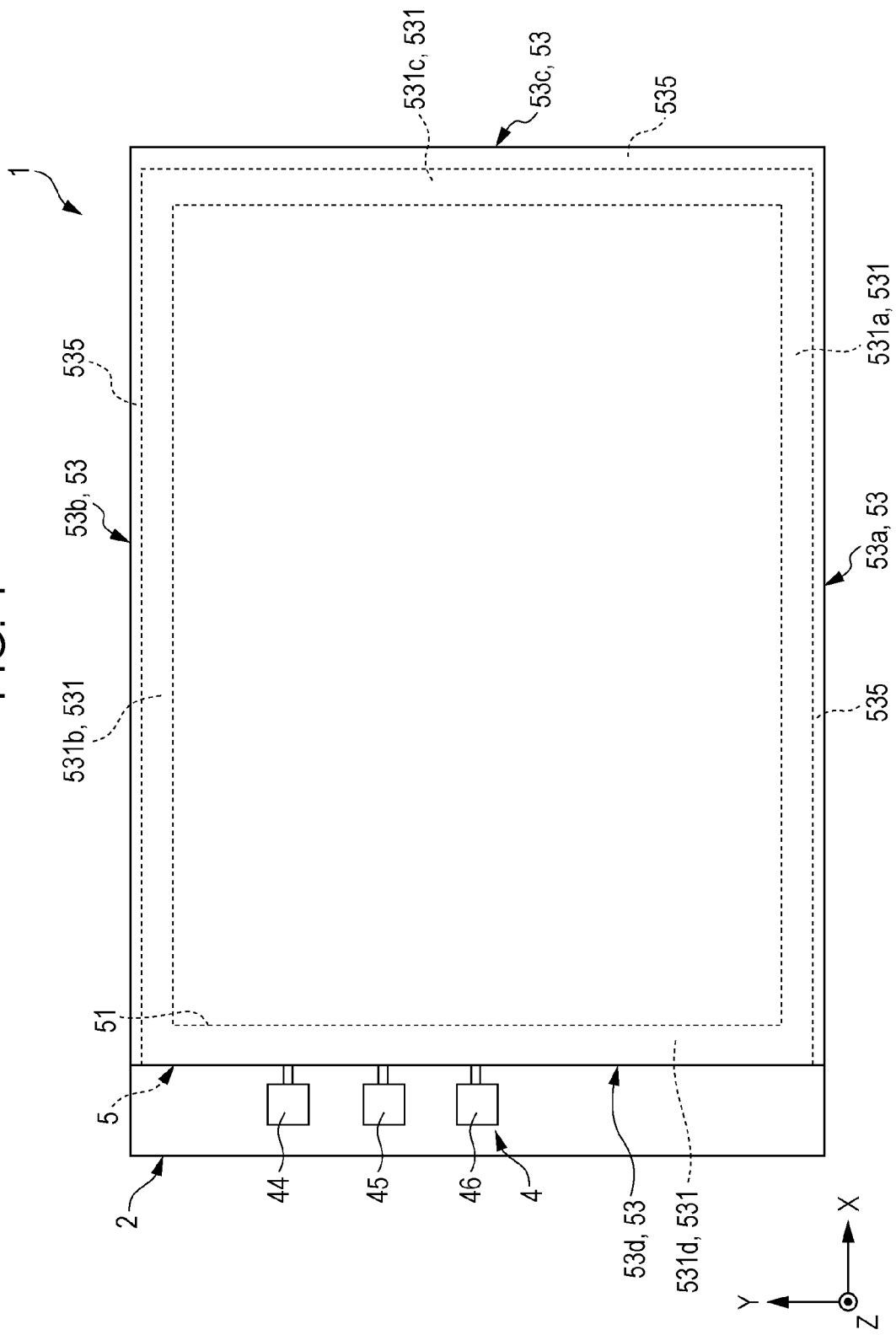
FIG. 1 is a plan view illustrating a physical quantity sensor according to a first embodiment of the invention.
Figure 2:
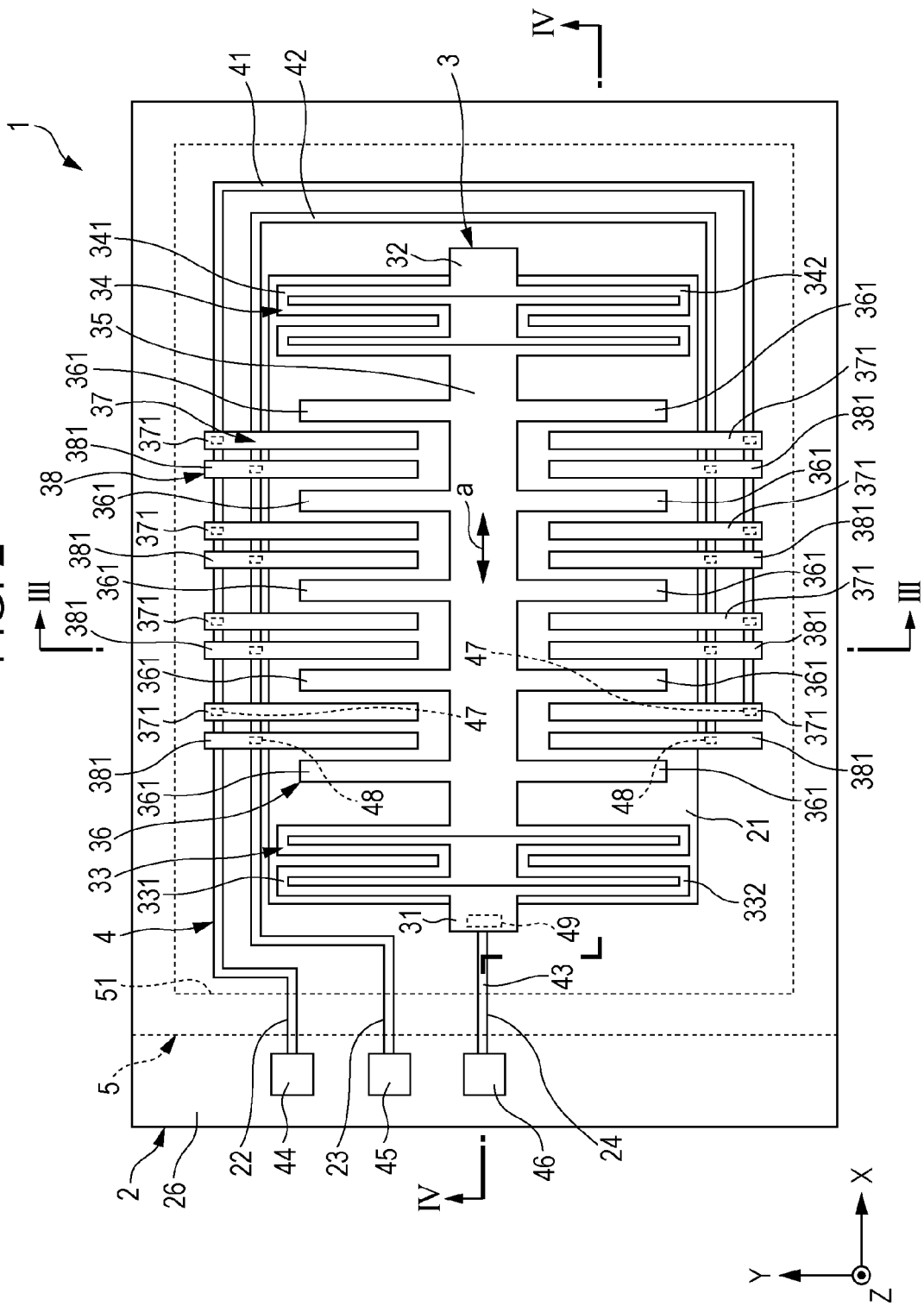
FIG. 2 is a plan view illustrating an acceleration detecting element (sensor element) illustrated in FIG. 1.
Figure 3:
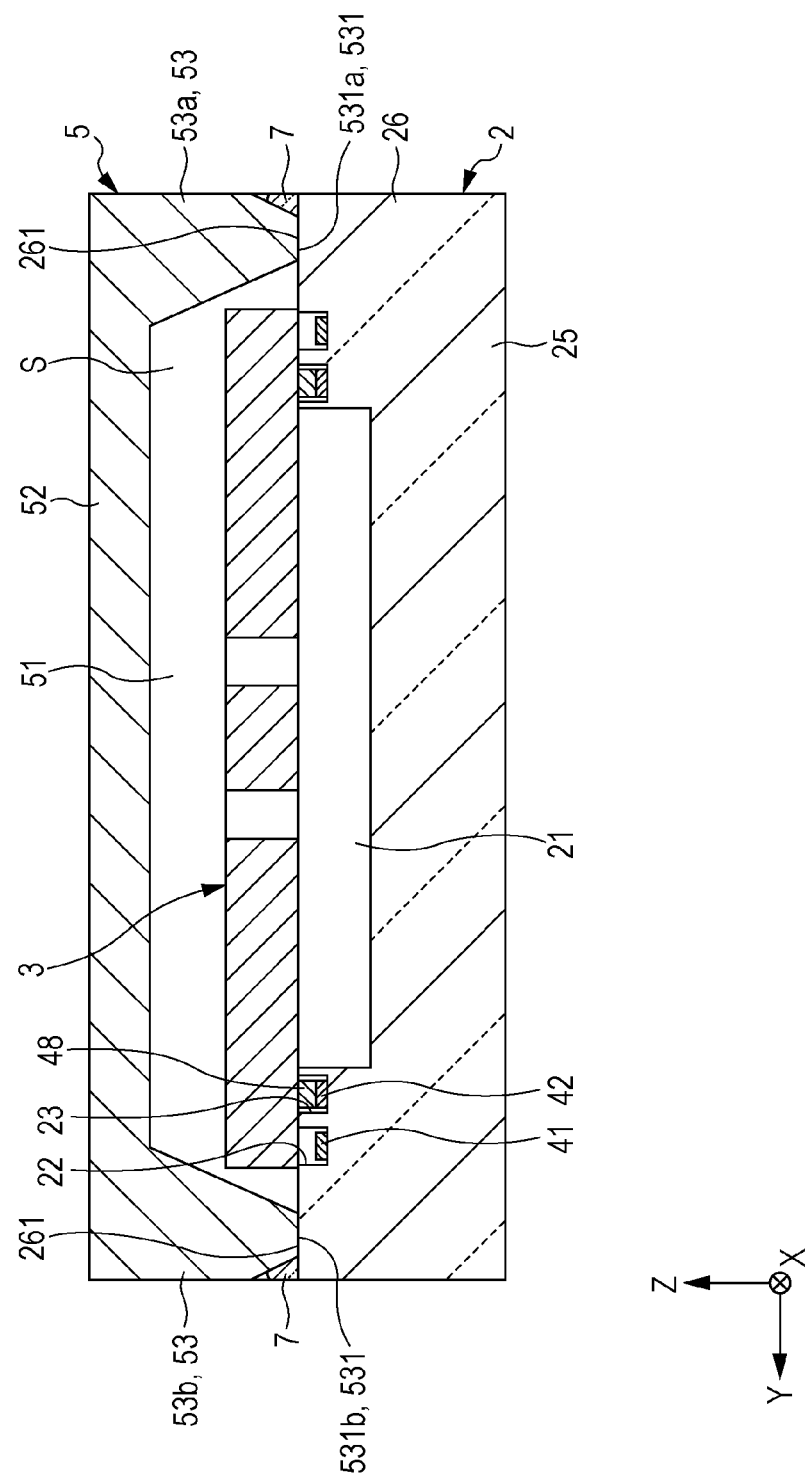
FIG. 3 is a sectional view taken along III-III line in FIG. 2.
Figure 4:
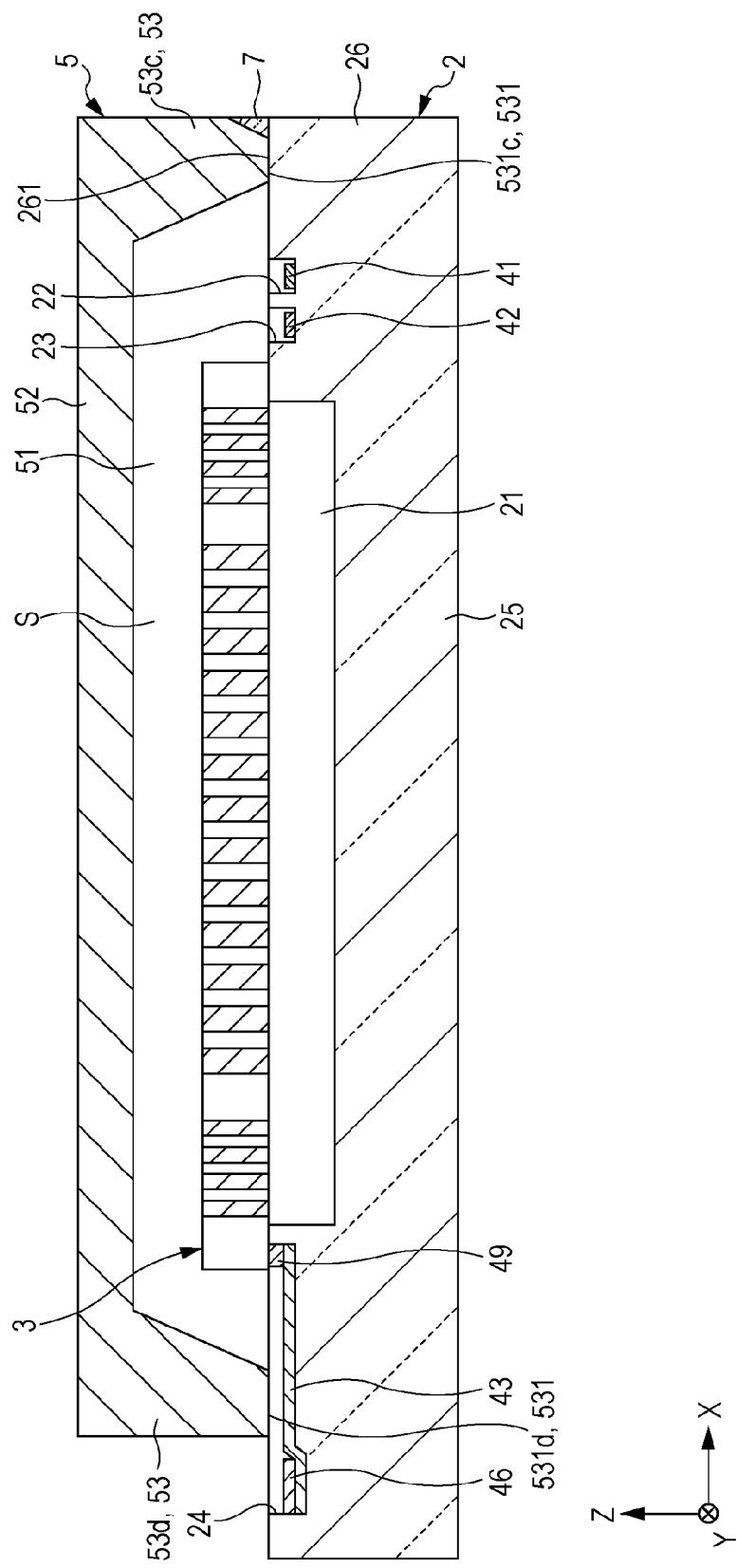
FIG. 4 is a sectional view taken along IV-IV line in FIG. 2.
Figure 5:
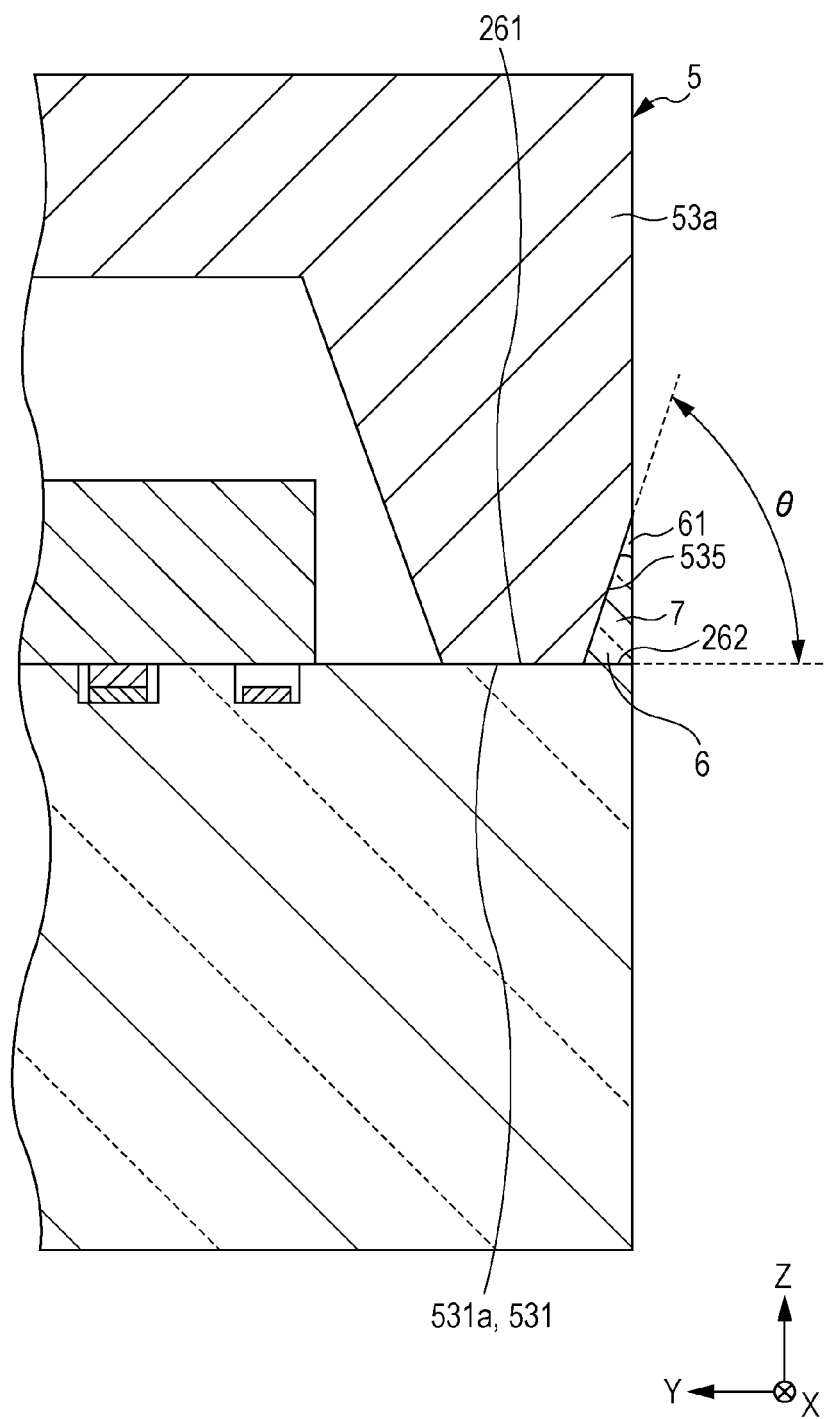
FIG. 5 is a partially enlarged sectional view of the acceleration detecting element illustrated in FIG. 3.

1. Physical Quantity Sensor and Method for Manufacturing Physical Quantity Sensor FIG. 1 is a plan view illustrating a physical quantity sensor according to a first embodiment of the invention. FIG. 2 is a plan view illustrating an acceleration detecting element (sensor element) illustrated in FIG. 1. FIG. 3 is a sectional view taken along III-III line in FIG. 2. FIG. 4 is a sectional view taken along IV-IV line in FIG. 2. FIG. 5 is a partially enlarged sectional view of the acceleration detecting element illustrated in FIG. 3. FIG. 6A to FIG. 10C are views for illustrating a method for manufacturing the physical quantity sensor illustrated in FIG. 3.

Hereinafter, for convenience of the description, in FIG. 1 and FIG. 2, a front side of a paper face is referred to as "up", a back side of the paper face is referred to as "down", a right side is referred to as "right", and a left side is referred to as "left". Moreover, in FIG. 1 to FIG. 5, an X axis, a Y axis, and a Z axis are illustrated as three axes which are orthogonal to each other. Sill more, hereinafter, a direction which is parallel to the X axis is referred to as "X axis direction", a direction (left and right direction) which is parallel to the Y axis is referred to as "Y axis direction", and a direction (up and down direction) which is parallel to the Z axis is referred to as "Z axis direction".

Physical Quantity Sensor

A physical quantity sensor 1 illustrated in FIG. 1, is an example of the physical quantity sensor of the invention, and is a sensor which is capable of detecting an acceleration of an in-plane direction which includes the X axis direction. As illustrated in FIG. 1 to FIG. 4, the physical quantity sensor 1 includes a supporting substrate 2, an acceleration detecting element (sensor element) 3 that is mounted on the supporting substrate 2, a conductive pattern 4 that has wirings 41, 42, and 43, and electrodes 44, 45, and 46 which are formed on the supporting substrate 2, and a sealing substrate 5 that is bonded to the supporting substrate 2 so as to cover the acceleration detecting element 3.

Supporting Substrate

The supporting substrate 2 is a member that supports the acceleration detecting element 3.

As illustrated in FIG. 3 and FIG. 4, the supporting substrate 2 includes a concave portion (opening) 21 of which a planar view shape is formed into a quadrangle shape, and which is open to an upper face at a central portion in the planar view. The acceleration detecting element 3 is arranged on the concave portion 21, and the concave portion 21 functions as a clearance portion for preventing a contact between the acceleration detecting element 3 and the supporting substrate 2.

The supporting substrate 2 includes a bottom portion 25 of a flat plate shape, and a side wall portion 26 of a frame shape which is arranged in an outer edge portion of the upper face of the bottom portion 25. Thereby, the concave portion (opening) 21 is defined. As illustrated in FIG. 2 to FIG. 4, a plurality of grooves 22, 23, and 24 are formed in the upper face of the side wall portion 26. The groove 22 is arranged along an outer periphery of the concave portion 21, and one end thereof extends to the outer edge portion of the –X side of the upper face of the side wall portion 26. The groove 23 is arranged along the outer periphery of the concave portion 21, on an inside of the groove 22, and one end thereof extends to the outer edge portion of the –X side of the side wall portion 26. The groove 24 is arranged into a straight line shape in the outer edge portion of the –X side of the side wall portion 26.

For example, the supporting substrate 2 is configured by a glass material (for example, borosilicate glass such as Pyrex Glass (registered trademark)) including alkali metal ions such as sodium (Na) or potassium (K). In the embodiment, the supporting substrate 2 is configured by the glass material including the alkali metal ions, but a configuration material of the supporting substrate 2 is not limited thereto. For example, a ceramic material or a silicon material may be used as a configuration material of the supporting substrate 2. However, when the silicon material is used as a main material in the configuration material of the acceleration detecting element 3 described later, it is preferable that the glass material including the alkali metal ions is used as a main material in the configuration material of the supporting substrate 2. Thereby, it is possible to bond the supporting substrate 2 and the acceleration detecting element 3 in an anodic manner, and it is possible to bond the supporting substrate 2 and the acceleration detecting element 3 more firmly.

Acceleration Detecting Element

As illustrated in FIG. 2, the acceleration detecting element 3 includes fixing portions 31 and 32, connecting portions 33 and 34, a movable portion 35, a movable electrode portion 36 that includes a plurality of movable electrode fingers 361, a first fixing electrode portion 37 that includes a plurality of first fixing electrode fingers 371, and a second fixing electrode portion that includes a plurality of second fixing electrode fingers 381. Furthermore, the fixing portions 31 and 32, the connecting portions 33 and 34, the movable portion 35, and the movable electrode portion 36 are integrally formed. For example, the acceleration detecting element 3 is formed from a silicon substrate to which impurities such as phosphorus or boron are doped.

The fixing portions 31 and 32 are respectively bonded to the upper face of the side wall portion 26 of the supporting substrate 2 in the anodic manner, and the fixing portions 31 and 32 are arranged in the vicinity of the outer edge of the concave portion 21, so as to face each other through the concave portion 21 in the planar view. Thereby, the movable portion 35, the connecting portions 33 and 34, and the movable electrode portion 36 are respectively arranged so as not to be in contact with the supporting substrate 2 on the concave portion 21.

The movable portion 35 is formed into a long shape extending in the X axis direction, and is arranged between the fixing portions 31 and 32.

The connecting portion 33 connects the movable portion 35 to the fixing portion 31, and the connecting portion 34 connects the movable portion 35 to the fixing portion 32. The connecting portions 33 and 34 are respectively configured so as to be capable of displacing the movable portion 35 in the X axis direction. The connecting portion 33 is configured by two beams 331 and 332 which are formed into shapes extending in the X axis direction while meandering in the Y axis direction, and the connecting portion 34 is configured by two beams 341 and 342 which are formed into the shapes extending in the X axis direction while meandering in the Y axis direction.

The movable electrode portion 36 includes the plurality (ten in the embodiment) of movable electrode fingers 361 extending from the movable portion 35. The movable electrode fingers 361 are respectively connected to the movable portion 35, and are formed into the long shape extending from the movable portion 35 in the Y axis direction (+Y axis direction or –Y axis direction). Moreover, the movable electrode fingers 361 are arranged at regular intervals in the X axis direction so as to be formed into a comb teeth shape.

The first fixing electrode portion 37 includes the plurality (eight in the embodiment) of first fixing electrode fingers 371. The first fixing electrode fingers 371 are respectively arranged on one side (–X direction side) of the movable electrode fingers 361, and are lined up so as to be formed into the comb teeth shape meshing with the movable electrode fingers 361 which correlate with the first fixing electrode fingers 371 at intervals. In the plurality of first fixing electrode fingers 371, respectively, one end portion is bonded to the upper face of the side wall portion 26 of the supporting substrate 2 as a fixing end, and the other end portion is positioned on the concave portion 21 by extending to the movable portion 35 side as a free end.

The second fixing electrode portion 38 includes the plurality (eight in the embodiment) of second fixing electrode fingers 381. The second fixing electrode fingers 381 are respectively arranged on the other side (+X direction side) of the movable electrode fingers 361, and are lined up so as to be formed into the comb teeth shape meshing with the movable electrode fingers 361 which correlate with the second fixing electrode fingers 381 at intervals. In the plurality of second fixing electrode fingers 381, respectively, one end portion is bonded to the upper face of the side wall portion 26 of the supporting substrate 2 as a fixing end, and the other end portion is positioned on the concave portion 21 by extending to the movable portion 35 side as a free end.

Conductive Pattern

As illustrated in FIG. 2, the conductive pattern 4 includes the wirings 41, 42, and 43, and the electrodes 44, 45, and 46. As illustrated in FIG. 1, the electrodes 44, 45, and 46 are arranged by being exposed to the outside in the outer edge portion on the −X axis side of the supporting substrate 2.

The wiring 41 is arranged along the outer periphery of the concave portion 21, within a groove 22 which is formed in the supporting substrate 2. Moreover, the wiring is electrically connected to the electrode 44 of which one end is arranged in the outer edge portion on the −X axis side of the side wall portion 26. Still more, the wiring 41 is electrically connected to the plurality of first fixing electrode fingers 371 through a plurality of protrusions (conductive bumps) 47 having conductivity.

The wiring 42 is arranged on the inside of the wiring 41, and along the outer periphery of the concave portion 21, within a groove 23 which is formed in the supporting substrate 2. Moreover, the wiring 42 is electrically connected to the electrode 45 of which one end is arranged in the outer edge portion on the −X axis side of the side wall portion 26. Still more, the wiring 42 is electrically connected to the plurality of second fixing electrode fingers 381 through a plurality of protrusions (conductive bumps) 48 having conductivity.

The wiring 43 is arranged so as to extend into the straight line in the outer edge portion on −X axis side of the side wall portion 26, within a groove 24 which is formed in the supporting substrate 2. Moreover, the wiring 43 is electrically connected to the electrode 46 of which one end is arranged in the outer edge portion on the −X axis side of the side wall portion 26. Still more, the wiring 43 is electrically connected to the fixing portion 31 through a plurality of protrusions (conductive bumps) 49 having conductivity.

The configuration materials of the wirings 41, 42, and 43, and the configuration materials of the electrodes 44, 45, and 46 are not particularly limited, if each of the configuration materials have conductivity, and it is possible to use various types of electrode materials. For example, a metal simple substance such as Au, Pt, Ag, Cu or Al, or a metal such as an alloy including the metal simple substances is suitably used.

In the conductive pattern 4 having such the configuration, it is possible to measure the capacitance between the first fixing electrode portion 37 and the movable electrode portion 36, by the electrodes 44 and the electrode 46. Moreover, it is possible to measure the capacitance between the second fixing electrode portion 38 and the movable electrode portion 36, by the electrode 45 and the electrode 46.

Sealing Substrate

As illustrated in FIG. 3 and FIG. 4, the sealing substrate 5 includes a concave portion 51 of which the planar view shape is formed into the quadrangle shape, and which is open to a lower face at the central portion in the planar view. By bonding the sealing substrate 5 to the supporting substrate 2, a storage space S that stores the acceleration detecting element 3 is formed by the concave portion 51 and the concave portion 21. By bonding the sealing substrate 5 to the supporting substrate 2 in this manner, the acceleration detecting element 3 is airtightly sealed within the storage space S. Thereby, the dust or the moisture from the outside is prevented from infiltrating into the storage space S.

For example, the sealing substrate 5 is configured by a monocrystalline silicon substrate of which a plane orientation of a surface is a (100) plane, and the sealing substrate 5 and the supporting substrate 2 are bonded by an anodic bonding method. In this manner, since the sealing substrate 5 and the supporting substrate 2 are bonded in the anodic manner, it is possible to bond the supporting substrate 2 and the sealing substrate 5 more firmly. Therefore, it is possible to secure airtightness of the storage space S to be higher.

In the embodiment, the sealing substrate 5 is configured by the monocrystalline silicon substrate as described above, but the configuration material of the sealing substrate 5 is not limited thereto. For example, a ceramic material, a glass material, or the like may be used as a configuration material of the sealing substrate 5. However, when the supporting substrate 2 is configured by the glass material including the alkali metal ions, it is preferable that the silicon material is used as a main material in the configuration material of the sealing substrate 5. Thereby, as described above, since the sealing substrate 5 and the supporting substrate 2 can be bonded in the anodic manner, it is possible to bond the sealing substrate 5 and the supporting substrate 2 more firmly.

Moreover, in the embodiment, since the inside and outside of the storage space S are communicated with each other through the grooves 22, 23, and 24 which are formed in the supporting substrate 2 in a state of bonding the sealing substrate 5 to the supporting substrate 2, although not illustrated, for example, the grooves 22, 23, and 24 are closed by a sealing material which is configured of a resin material, an oxide, or the like. Furthermore, depending on the configuration of the groove which is formed in the supporting substrate 2 or the configuration of the conductive pattern 4, the sealing material may not be used.

The sealing substrate 5 includes a top portion 52 of a flat plate shape, and a side wall portion 53 of a frame shape which is arranged in the outer edge portion of the lower face of the top portion 52, and a concave portion 51 is formed by the top portion 52 and the side wall portion 53. Therefore, the bonding of the sealing substrate 5 and the supporting substrate 2 is formed by a bonded face 531 being the lower face (second face) of the side wall portion 53, and a bonded face 261 being the upper face (first face) of the side wall portion 26.

More specifically, as illustrated in FIG. 1, FIG. 3 and FIG. 4, the side wall portion 53 includes a pair of side walls 53a and 53b which extend along the X axis direction, and a pair of side walls 53c and 53d which connect to both ends of the side wall 53a and the side wall 53b, and extend along the Y axis direction. Therefore, as illustrated in FIG. 1, FIG. 3, and FIG. 4, a bonded face 531a being the lower face (second face) of the side wall 53a, a bonded face 531b being the lower face (second face) of the side wall 53b, a bonded face 531c being the lower face (second face) of the side wall 53c, and a bonded face 531d being the lower face (second face) of the side wall 53d are bonded to the bonded face 261 of the supporting substrate 2.

In the side wall 53, inclined faces (notch) 535 are respectively formed in three side walls 53a, 53b, and 53c other than the side wall 53*d* of the side where the electrodes 44, 45, and 46 of the supporting substrate 2 are formed (see FIG. 1 and FIG. 5)

The inclined face 535 which is arranged in the side wall 53*a*, is arranged along a longer direction of the side wall 53*a* in a lower end portion on the outside of the side wall 53*a*. The inclined face 535 which is arranged in the side wall 53*b*, is arranged along the longer direction of the side wall 53*b* in the lower end portion on the outside of the side wall 53*b*, and the inclined face 535 which is arranged in the side wall 53*c*, is arranged along the longer direction of the side wall 53*c* in the lower end portion on the outside of the side wall 53*c*.

Hereinafter, the configurations of the respective inclined faces 535 which are arranged the side walls 53*a*, 53*b*, and 53*c*, and the configuration in the vicinity thereof will be described, but since the configurations of the respective inclined faces 535 which are arranged the side walls 53*a*, 53*b*, and 53*c*, and the configuration in the vicinity thereof are the same, the configuration of the inclined face 535 which is arranged in the side wall 53*a*, and the configuration in the vicinity thereof will be described as a representative.

As illustrated in FIG. 5, the inclined face 535 connects a side face of the side wall 53*a* to the bonded face 531, and is inclined to the bonded face 531 at an angle θ. In the embodiment, the angle θ of the inclined face 535 is approximately 54.7°.

Here, a loss portion 6 is formed by the inclined face 535, and a facing face 262 being a portion which faces (correlates with) the inclined face 535 in the upper face of the supporting substrate 2.

In the loss portion 6, a filling material 7 is arranged so as to substantially fill in the loss portion 6, and an outer surface of the filling material 7 forms one face with the side face of the sealing substrate 5. However, a slight gap 61 is present on the inclined face 535 side of the loss portion 6.

The filling material 7 which is arranged in the loss portion 6, functions as an adhesive material for attaching the facing face 262 and the inclined face 535. Therefore, the filling material 7 functions as a reinforcing member that reinforces the bonding of the bonded face 531 and the bonded face 261. Thereby, it is possible to make the bonding strength of the supporting substrate 2 and the sealing substrate 5 higher.

For example, a metal material, a glass material, or the like may be used as a configuration material of the filling material 7, and the glass material is preferably used. In particular, it is preferable that a low melting point glass material is used. Thereby, it is possible to fill the loss portion 6 with the filling material 7 at a temperature that the deformation due to heat is unlikely to occur in the supporting substrate 2 and the sealing substrate 5, and it is possible to bond the facing face 262 and the inclined face 535 more firmly by the filling material 7.

In particular, when the supporting substrate 2 is configured by the glass material including the alkali metal ions, and the sealing substrate 5 is configured by the silicon substrate as the embodiment, since the filling material 7 is configured by the low melting point glass material as a main material, it is possible to bond the inclined face 535 and the facing face 262 even more firmly by the filling material 7. Here, the low melting point glass material is referred to as a glass material having a glass transition temperature of 600° C. or lower. Specifically, for example, $PbO$—$SiO_2$—$B_2O_3$, $Na_2O$—$P_2O_5$—$SiO_2$, or the like may be used as a low melting point glass material.

Hitherto, the configuration of the physical quantity sensor 1 is described. Such the physical quantity sensor detects an acceleration of the X axis direction in the following manner.

That is, if the acceleration of the X axis direction is applied to the physical quantity sensor 1, depending on a change in the acceleration of the X axis direction, the movable portion 35 and the movable electrode finger 361 of the acceleration detecting element 3 are displaced in the X axis direction (+X axis direction or the −X direction) as illustrated by an arrow a in FIG. 2 while the connecting portions 33 and 34 are elastically deformed. Along with such the displacement, the gap between the movable electrode finger 361 and the first fixing electrode finger 371, and the gap between the movable electrode finger 361 and the second fixing electrode finger 381 are respectively changed in size. Thereby, the size of the capacitance between the movable electrode portion 36 and the first fixing electrode portion 37, and the size of the capacitance between the movable electrode portion 36 and the second fixing electrode portion 38 are changed. Based on the changes in the capacitance, it is possible to calculate the acceleration of the X axis direction which is applied to the physical quantity sensor 1.

Method for Manufacturing Physical Quantity Sensor

Next, a method for manufacturing the physical quantity sensor 1 (method for manufacturing a physical quantity sensor of the invention) will be described.

The method of manufacturing the physical quantity sensor 1 includes 1 a preparing process of preparing a plurality of acceleration detecting elements 3, a first substrate 20 (parent material of the supporting substrate 2) for forming the supporting substrate 2, and a second substrate 50 (parent material of the sealing substrate 5) for forming the sealing substrate 5, 2 a bonding body forming process of forming a bonding body 10 by bonding the first substrate 20, and the second substrate 50, and 3 a cutting process of cutting and dicing the bonding body 10 by using a dicing blade.

1. Preparing Process

First, the plurality of acceleration detecting elements 3, the first substrate 20, and the second substrate 50 are prepared.

The preparing process includes 1-1 preparing the plurality of acceleration detecting elements 3, and the first substrate 20, 1-2 preparing the second substrate 50, and 1-3 arranging the filling material 7 in the second substrate 50.

1-1

The first substrate 20 which includes two main faces 201 and 202 facing each other, and the plurality of acceleration detecting elements 3 are prepared.

Figure 6A:
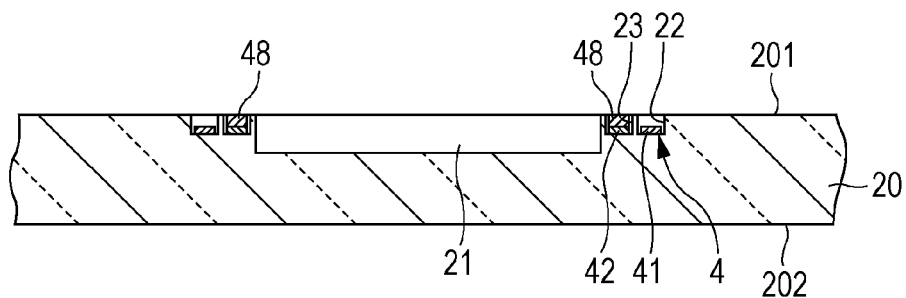
FIG. 6A to FIG. 6C are views for illustrating a method for manufacturing the physical quantity sensor illustrated in FIG. 3.

Specifically, first, as illustrated in FIG. 6A, for example, a glass substrate including alkali metal ions such as sodium (Na) and potassium (K) is prepared, and a patterning is performed by a photolithography method and an etching method. Thereby, the concave portion 21 and the grooves 22 and 23 are formed in the glass substrate. At this time, although not illustrated in FIG. 6A, the groove 24 is similarly formed in the above manner. Thereby, it is possible to obtain the first substrate 20 where the plurality of supporting substrates 2 are integrally formed.

Subsequently, a metal film is formed on the main face 201 of the first substrate 20, and the metal film is patterned by the photolithography method and the etching method. Thereby, the plurality of wirings 41 and 42 are formed. At this time, although not illustrated in FIG. 6A, the wiring 43, and the electrodes 44, 45, and 46 are similarly formed in the above manner. Subsequently, the plurality of protrusions (conductive bumps) 48 are formed on the wiring 42. At this time, although not illustrated in FIG. 6A, the plurality of protrusions (conductive bumps) 47 are formed on the wiring 41, or the protrusion (conductive bumps) 49 are formed on the wiring 43. In this manner, the conductive pattern 4 is formed on the first substrate 20.

Figure 6B:
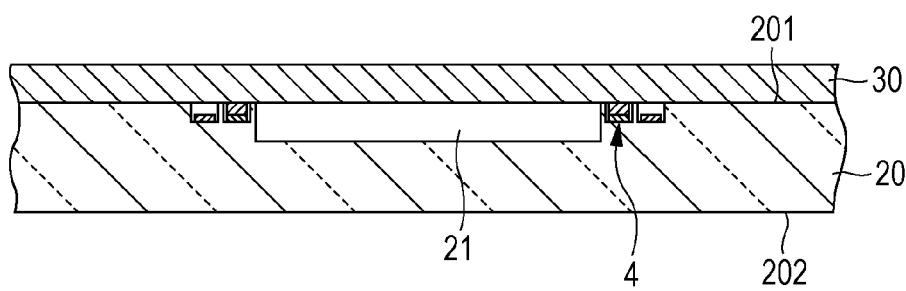

Next, as illustrated in FIG. 6B, a silicon substrate 30 is bonded to one main face 201 of the first substrate 20 in the anodic manner. After the silicon substrate 30 is bonded in the anodic manner, as necessary, for example, the silicon substrate 30 may be thinned by a CMP method or a dry polishing method. Moreover, the bonding of the silicon substrate 30 and the first substrate 20 is not limited to the anodic bonding, and for example, a bonding which uses the adhesive material or the like may be used. However, since the silicon substrate 30 and the first substrate 20 are bonded in the anodic manner, it is possible to make the bonding strength thereof higher.

Figure 6C:
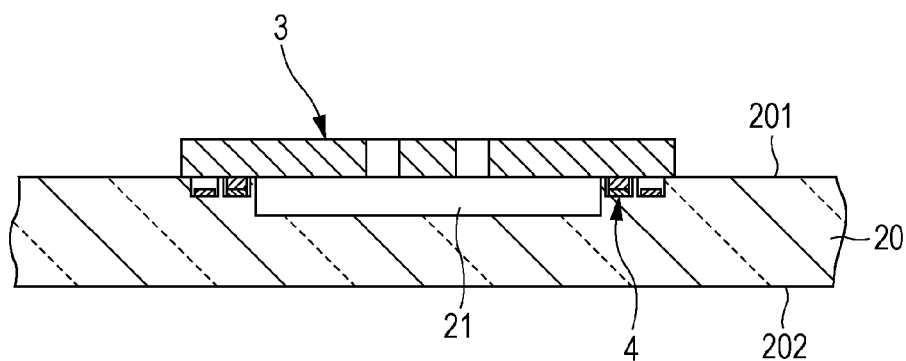

Next, as illustrated in FIG. 6C, the silicon substrate 30 is patterned by the photolithography method and the etching method. Thereby, the acceleration detecting element 3 correlating with the concave portion 21 is formed.

In this manner, it is possible to obtain the first substrate 20, and the plurality of acceleration detecting elements 3 which are arranged on the first substrate 20 so as to overlap with the concave portion 21 in the planar view.

1-2

Next, the second substrate 50 (parent material of the sealing substrate 5) for forming the sealing substrate 5 is prepared.

Figure 7A:
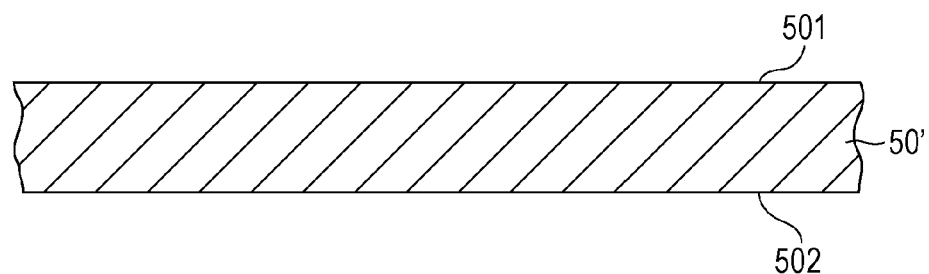
FIG. 7A to FIG. 7C are views for illustrating the method for manufacturing the physical quantity sensor illustrated in FIG. 3.

Specifically, first, as illustrated in FIG. 7A, for example, a monocrystalline silicon substrate 50' of which the plane orientation of two main faces 501 and 502 facing each other is the (100) plane, is prepared.

Figure 7B:
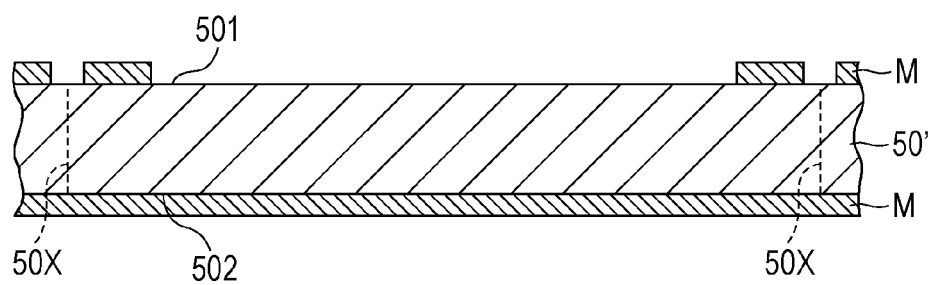

Next, as illustrated in FIG. 7B, by the photolithography method, the silicon substrate 50' is heated and treated at approximately 1100° C. in a steam atmosphere, and a thermal oxide film ($SiO_2$ film) having a thickness of 1 μm is formed on the entire face of the silicon substrate 50'. Thereafter, the thermal oxide film is patterned. Thereby, a mask M is formed on the entire face of the silicon substrate 50'. The mask M is open to a spot correlating with the concave portion 51, and a groove (concave portion) 520 in the planar view, on the main face 501 side. Furthermore, the groove 520 is a portion which forms the loss portion 6, through the subsequent process.

Figure 7C:
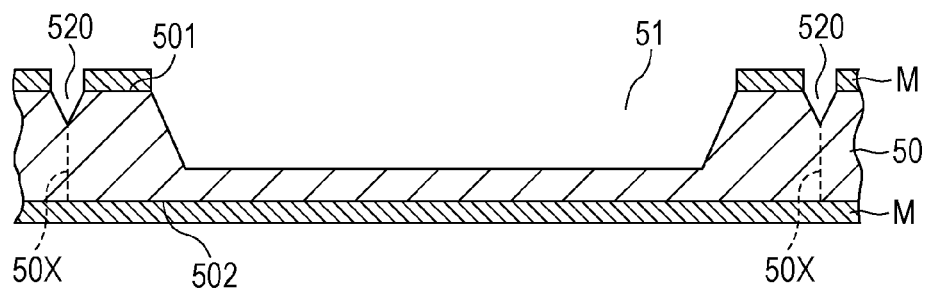

Next, as illustrated in FIG. 7C, for example, the silicon substrate 50' is wet-etched by an alkaline etching solution such as a potassium hydroxide (KOH) aqueous solution through the mask M. Thereby, the concave portion and the groove 520 are formed in the silicon substrate 50'. Thereafter, for example, by performing a wet etching by a hydrofluoric acid aqueous solution or the like, the mask M is removed. Thereby, as illustrated in FIG. 8, it is possible to obtain the second substrate 50 where the plurality of sealing substrates 5 are integrally formed.

Figure 8:
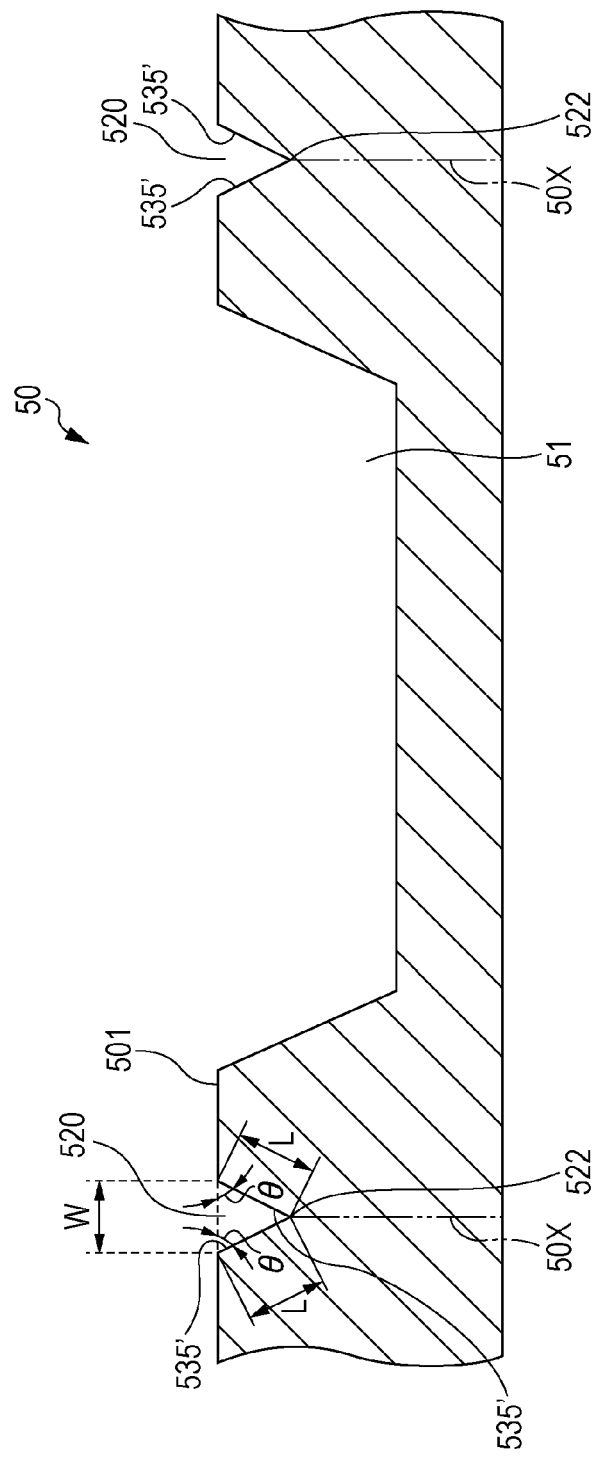
FIG. 8 is a view for illustrating the method for manufacturing the physical quantity sensor illustrated in FIG. 3.

As illustrated in FIG. 8, the groove 520 (more particularly, a top portion 522 of the groove 520) which is formed on the second substrate 50, is formed so as to overlap with a scheduled cutting portion 50X of the second substrate 50 in the second substrate 50 in the planar view. Furthermore, for example, the scheduled cutting portion 50X is a portion which is cut by using the dicing blade in the subsequent process.

Moreover, the groove 520 is formed by a pair (two) of inclined faces 535'. Lengths L of the pair of inclined faces 535' are substantially equal, and a portion to which the pair of inclined faces 535' portion are connected configures the top portion 522. Therefore, a sectional shape of the groove 520 is formed into a triangle (more specifically, an isosceles triangle), as illustrated in FIG. 8.

Still more, the plurality of inclined faces 535' are respectively inclined to the main face 501 of the second substrate 50 at the angle θ. The angle θ is an angle θ which is formed by the main face 501 and the inclined face 535', and the angle θ is approximately 54.7° in the embodiment.

The inclined face 535' is inclined in this manner, and it caused by that an etching rate of the face of which the plane orientation is (111) is slower than that of the face of which the plane orientation is (100) due to crystal anisotropy thereof, in the second substrate 50 which is configured by the monocrystalline silicon substrate. Since the second substrate 50 is configured of the monocrystalline silicon substrate of which the plane orientation of the main face 501 is (100), the inclined face 535' which is inclined to the main face 501 is formed by performing the wet etching (anisotropic etching) as described above.

Additionally, since the second substrate 50 is cut in the subsequent process, the inclined face 535' becomes the inclined face 535 which is included in the sealing substrate 5. Therefore, since the second substrate 50 of which the plane orientation of the main face 501 is (100) is used, and is wet-etched as described above, it is possible to easily form the inclined face 535 which is inclined to the main face 501.

1-3

Figure 9:
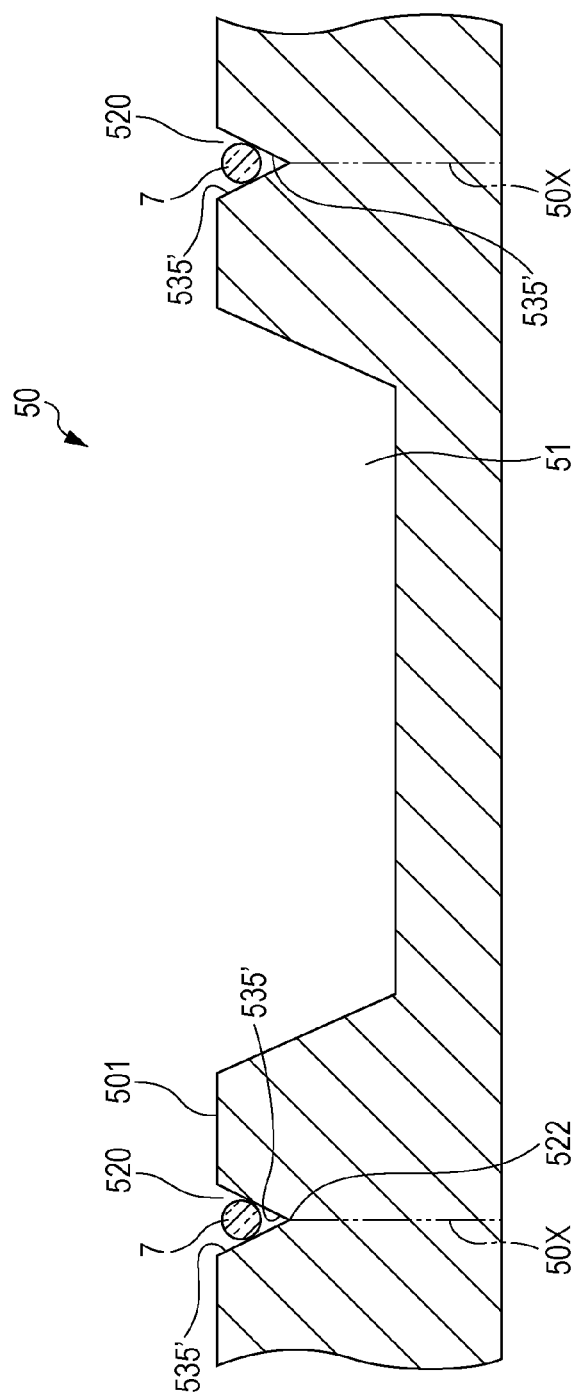
FIG. 9 is a view for illustrating the method for manufacturing the physical quantity sensor illustrated in FIG. 3.

Next, as illustrated in FIG. 9, for example, the filling material 7 of a solid state which is configured by the low melting point glass material, is arranged in the groove 520 that is formed in the second substrate 50. In this manner, the filling material 7 is arranged in the groove 520, before the forming of the following bonding body.

As a filling material 7 which is arranged within the groove 520, a glass rod of which the sectional shape is formed into a circular shape is used. Furthermore, the sectional shape of the filling material 7 is not limited to the circular shape, and for example, the sectional shape may be a polygonal shape such as the triangle or the quadrangle shape. However, since being easily available, being apt to be arranged within the groove 520, and being excellent in stability within the groove 520, it is preferable that the filling material 7 of which the sectional shape is the circular shape is used.

Moreover, it is preferable that the filling material 7 of which the size fits within the groove 520 is used in the process. That is, it is preferable that the filling material 7 of which the size does not protrudes from the main face 501 in a side view of the second substrate 50 is used, in the state of arranging the filling material 7 within the groove 520. Thereby, at the time of bonding the first substrate 20 and the second substrate 50 in the following "2. Bonding Body Forming Process", it is possible to prevent the filling material 7 from being interposed in a portion where the bonding of the first substrate 20 and the second substrate 50 is hindered, that is, in a portion where the first substrate 20 and the second substrate 50 are directly bonded.

Hitherto, the preparing process is described. In the above description, the second substrate 50 is prepared after the first substrate 20 and the acceleration detecting element 3 are prepared, but the first substrate 20 and the acceleration detecting element 3 may be prepared after the second substrate 50 is prepared, or the first substrate 20, the acceleration detecting element 3, and the second substrate 50 may be prepared at the same time.

2. Bonding Body Forming Process

Next, the bonding body 10 is formed by bonding the first substrate 20 and the second substrate 50.

Specifically, first, as illustrated in FIG. 10A, the second substrate 50 is arranged on the first substrate by that one concave portion 51 correlates with one concave portion 21. Thereby, the acceleration detecting element 3 is arranged within a space which is formed by the concave portion 21 and the concave portion 51, and the state where the filling material 7 is arranged within the groove 520 (more specifically, within a space which is formed by the main face 201 and the groove 520) is made.

Subsequently, as illustrated in FIG. 10B, if the main face 201 of the first substrate 20, and the main face 501 of the second substrate 50 are increased in temperature, and reach at a predetermined temperature (for example, approximately 400° C.), a predetermined voltage (for example, approximately 800V) is applied to both of the first substrate 20 and the second substrate 50. Thereby, the first substrate 20 and the second substrate 50 are bonded in the anodic manner. Thereafter, the applying of the voltage to the first substrate 20 and the second substrate 50 is stopped, and the first substrate 20 and the second substrate are decreased in temperature. Thereby, the first substrate 20 and the second substrate 50 are bonded by the main face 201 and the main face 501. Thereby, the bonded face 531 and the bonded face 261 are formed.

Moreover, the filling material 7 is melted within the groove 520 due to the heat at the time of the anodic bonding. Thereby, the filling material 7 is deformed into a liquid state, and wetly spreads within the groove 520. Therefore, the filling material 7 is solidified within the groove 520 due to the temperature decrease after the anodic bonding. Thereby, the filling material 7 attaches the first substrate 20, and the second substrate 50 within the groove 520. Furthermore, a slight gap 61' is formed on the second substrate 50 side of the groove 520.

Still more, although not illustrated, for example, the grooves 22, 23, and 24 that are communicated with the outside, are sealed by the sealing material which is configured by the resin material or the like, after the first substrate 20 and the second substrate 50 are bonded as described above. Furthermore, the sealing of the grooves 22, 23, and 24 may be omitted depending on the configuration of the first substrate 20, the configuration of the second substrate 50, or the like.

In this manner, it is possible to obtain the bonding body 10 where the first substrate 20 and the second substrate 50 are bonded illustrated in FIG. 10B.

3. Cutting Process

Next, as illustrated in FIG. 10C, for example, by using a dicing blade 82, the bonding body 10 is cut from the main face 502 side of the second substrate 50 side, and a notch 81 is formed. A portion of the notch 81 is formed so as to overlap with the groove 520 in the planar view. In this manner, by dicing the bonding body 10, it is possible to obtain the physical quantity sensor 1 illustrated in FIG. 3.

When the bonding body 10 is cut by using the dicing blade 82, since the groove 520 is arranged in the second substrate 50 as described above, it is possible to make the dicing blade 82 not to hit directly on the bonded faces 531 and 261, by cutting the bonding body 10 so as to overlap with the groove 520 in the planar view. Therefore, it is possible to prevent the impact which is generated by the cutting from being applied to the bonded faces 531 and 261. Moreover, since the filling material 7 is arranged within the groove 520, it is possible to protect the inclined face (notch) 535 which is formed by cutting the groove 520, or the bonded faces 531 and 261, by the filling material 7. Hence, it is possible to reduce the lowering of the bonding strength of the bonded faces 531 and 261 due to the impact, and the first substrate 20 and the second substrate 50 are peeled off. Still more, if the filling material 7 is not arranged within the groove 520, and the groove 520 is a cavity, a loss occurs, that is, a chipping is apt to occur in the first substrate 20 or the second substrate 50 at the time of cutting the bonding body 10, but in the embodiment, since the filling material 7 is arranged within the groove 520, it is possible to reduce the occurrence of the chipping. Additionally, if the chipping occurs, the peeling of the bonded faces 531 and 261 may occur on the basis of the loss spot, but according to the embodiment, such the problem is not generated. Therefore, it is possible to obtain the physical quantity sensor 1 with high reliability where the acceleration detecting element 3 is sealed by the supporting substrate 2 and the sealing substrate 5 at a high yield.

In the embodiment, the slight gap 61' is arranged on the top portion 522 side within the groove 520, but since the filling material 7 is arranged so as to substantially fill in the groove 520 as described above, it is possible to reduce the occurrence of the chipping described above. Furthermore, by cutting the bonding body 10, the gap 61 illustrated in FIG. 5 is obtained from the gap 61'. However, after cutting the bonding body 10, the filling material 7 may be further added to the gap 61, or an entire area of the gap 61 may be filled with the filling material 7. Thereby, it is possible to make the bonding strength of the supporting substrate 2 and the sealing substrate 5 higher.

Moreover, from the viewpoint that the dicing blade 82 is unlikely to hit directly on the bonded faces 531 and 261 described above, in the preparing process, it is preferable that the groove 520 is formed so that a width W thereof is larger than a width W1 of the dicing blade 82 (see FIG. 8). Specifically, when the width of the groove 520 is referred to as W μm, and the width of the dicing blade 82 is referred to as W1 μm, for example, a relationship between the width W and the width W1 is preferably 200 μm<W−W1<1000 μm, and more preferably 150 μm<W−W1<500 μm. Thereby, it is possible to more reliably prevent the dicing blade 82 from hitting directly on the bonded faces 531 and 261. Moreover, it is possible to suppress that a bonding area of the bonded faces 531 and 261 becomes small.

As described above, it is preferable that the width W of the groove 520 is larger than the width W1 of the dicing blade 82, but the width W of the groove 520 may be smaller than the width W1 of the dicing blade 82.

When the width W of the groove 520 is not sufficiently larger than the width W1 of the dicing blade 82, it is possible to more reliably prevent the first substrate and the second substrate 50 from being peeled off, by cutting a portion of an opposite side to the bonded faces 531 and 261 of the groove 520.

As described above, the bonded face 531 and the bonded face 261 are bonded in the anodic manner. On the other hand, in the groove 520, the inclined faces 535' are attached to each other by the filling material 7. In this manner, since the bonded face 531 and the bonded face 261 are bonded in the anodic manner, it is possible to further reduce the occurrence of the peeling of the bonded face 531 and the bonded face 261 by the impact.

Moreover, since the inclined face 535' is arranged on the second substrate 50 side which is cut ahead than the first substrate 20, it is possible to further reduce the occurrence of the peeling of the bonded face 531 and the bonded face 261 by the impact.

Still more, since the groove 520 is arranged so that the inclined face 535 is positioned on the outside of the bonded faces 531 and 261 of the supporting substrate 2 and the sealing substrate 5 which surround the acceleration detecting element 3, in the planar view (when viewed from the Z axis direction), it is possible to further reduce the occurrence of the peeling of the bonded face 531 and the bonded face 261 by the impact at the time of the cutting.

Hitherto, the method for manufacturing the physical quantity sensor 1 is described. Furthermore, as described above, the inclined face 535 is arranged in the sealing substrate 5, in the physical quantity sensor 1 of the embodiment. However, the inclined face 535 is not arranged in the sealing substrate 5, and instead, the inclined face may be arranged in the supporting substrate 2, or the inclined faces may be respectively arranged in both of the sealing substrate 5 and the supporting substrate 2. Even the case, as described above, it is possible to reduce the occurrence of the peeling of the first substrate 20 and the second substrate 50 by the impact which is caused by cutting the first substrate 20 and the second substrate 50. However, as described above, it is preferable that the inclined face is arranged on the substrate (sealing substrate 5 in the embodiment) side where the cutting of the first substrate 20 and the second substrate 50 is started. Thereby, it is possible to more effectively reduce the occurrence of the peeling of the bonded face 531 and the bonded face 261 by the impact.

Moreover, in the sealing substrate 5, three inclined faces 535 are arranged, but the number of inclined faces 535 is not particularly limited. Still more, the number of grooves 520 of the second substrate 50 is not limited. The groove 520 may be arranged at the spot where the second substrate 50 is cut.

In the above description, the notch is configured by the inclined faces 535, but the notch may not be configured by the inclined faces. For example, the notch may be formed by a face which is parallel to an X-Y face, and a face which orthogonal thereto. Moreover, in the above description, the groove (concave portion) 520 is formed by two inclined faces 535', but the groove (concave portion) 520 may not be formed by the inclined faces. For example, the sectional shape of the groove 520 may be formed into the quadrangle shape. Even in the case, it is possible to obtain the same effect as the effect which is obtained by arranging the inclined face 535.

2. Electronic Device

Subsequently, an electronic device to which the physical quantity sensor of the invention is applied (electronic device of the invention) will be described in detail, based on FIG. 11 to FIG. 13.

Figure 11:
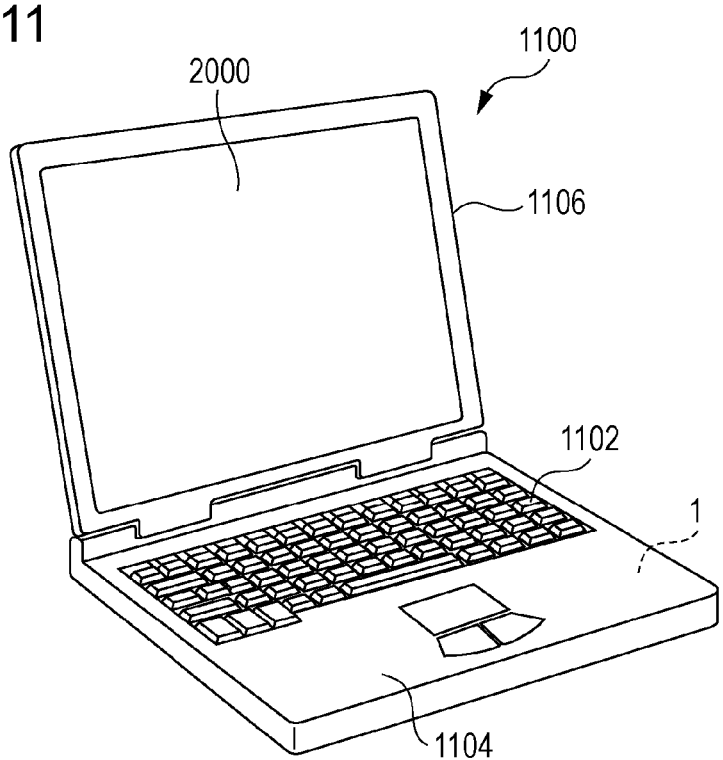
FIG. 11 is a perspective view illustrating a configuration of a mobile type (or notebook type) personal computer to which an electronic device of the invention is applied.

FIG. 11 is a perspective view illustrating a configuration of a mobile type (or notebook type) personal computer to which an electronic device of the invention is applied. In FIG. 11, a personal computer 1100 is configured by a main body portion 1104 including a keyboard 1102, and a display unit 1106 including a display portion 2000, and the display unit 1106 is rotatably supported through a hinge structure portion with respect to the main body portion 1104. The physical quantity sensor 1 which functions as a filter, a resonator, a reference clock, or the like, is built in the personal computer 1100.

Figure 12:
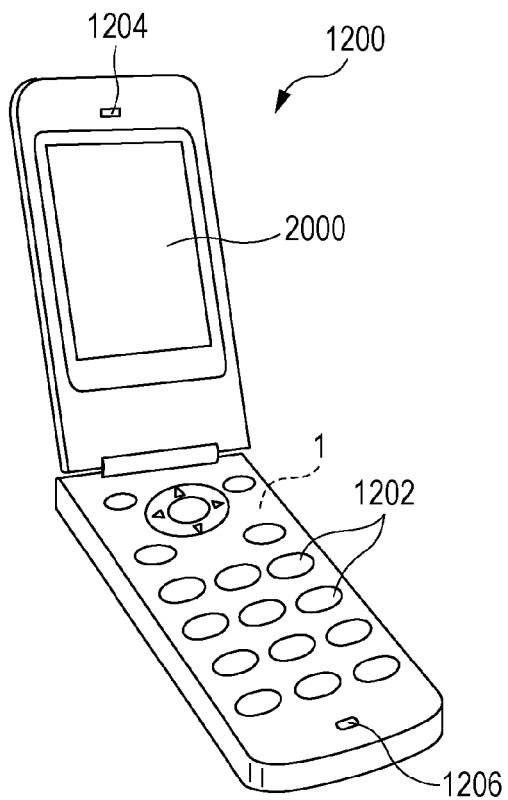
FIG. 12 is a perspective view illustrating a configuration of a cellular phone (also including a PHS) to which the electronic device of the invention is applied.

FIG. 12 is a perspective view illustrating a configuration of a cellular phone (also including a PHS) to which the electronic device including the physical quantity sensor of the invention is applied. In FIG. 12, a cellular phone 1200 includes a plurality of operation buttons 1202, an ear piece 1204, and a mouthpiece 1206, and the display portion 2000 is arranged between the operation buttons 1202 and the ear piece 1204. The physical quantity sensor 1 which functions as the filter, the resonator, or the like, is built in in the cellular phone 1200.

Figure 13:
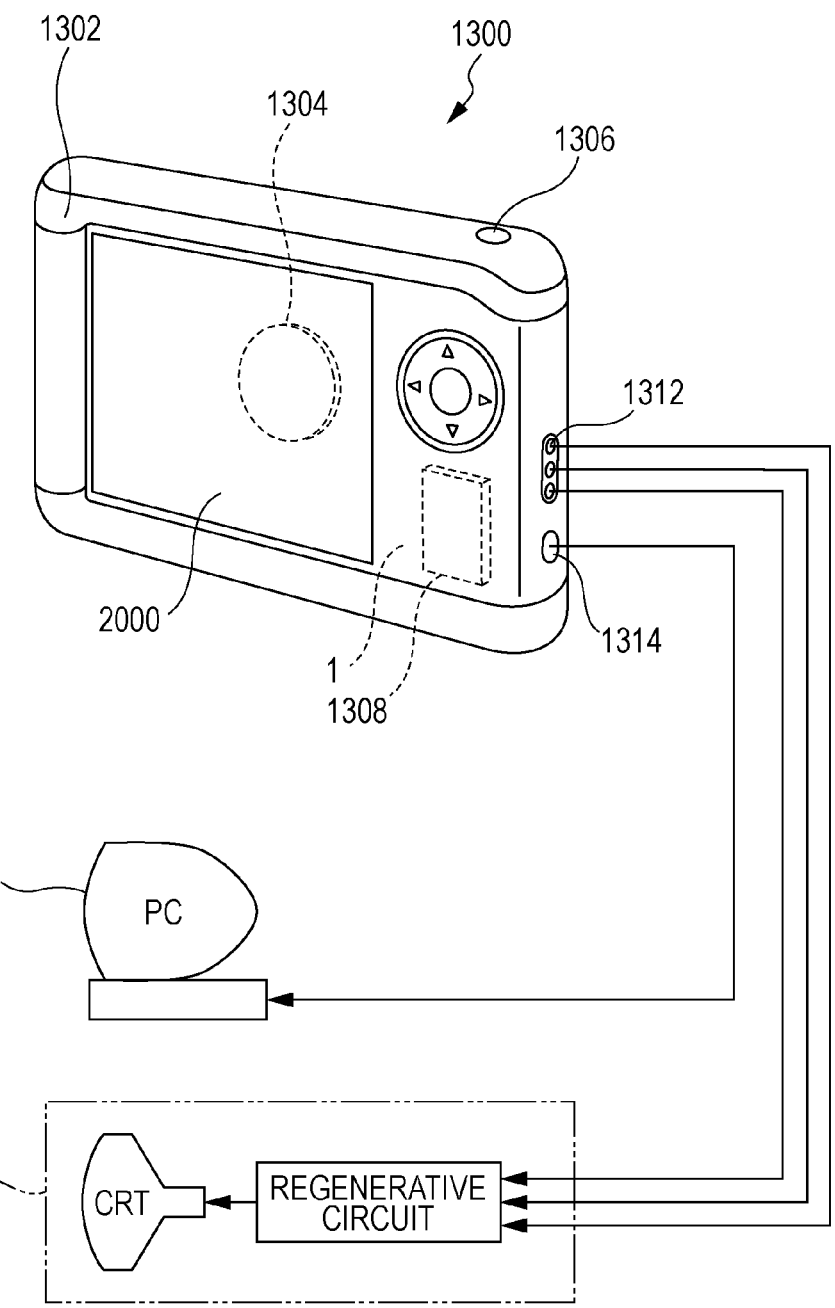
FIG. 13 is a perspective view illustrating a configuration of a digital still camera to which the electronic device of the invention is applied.

FIG. 13 is a perspective view illustrating a configuration of a digital still camera to which the electronic device including the physical quantity sensor of the invention is applied. In FIG. 13, the connection to external devices is illustrated in a simplified manner. Here, in the normal camera, a silver salt photographic film is exposed to the light by a light image of a subject. In contrast, a digital still camera 1300 generates an imaging signal (image signal) by photoelectrically converting the light image of the subject with an imaging element such as a charge coupled device (CCD).

In the digital still camera 1300, the display portion 2000 is arranged on a back face of a case (body) 1302, and is configured to carry out a display based on the imaging signal by the CCD, and the display portion 2000 functions as a finder of displaying the subject as an electronic image. Moreover, a light-receiving unit 1304 including an optical lens (imaging optical system), the CCD, or the like is arranged, on a front face side (rear face side in FIG. 13) of the case 1302.

If a photographer confirms a subject image which is displayed in the display portion, and presses a shutter button 1306, the imaging signal of the CCD at that time is transferred and stored in a memory 1308. Moreover, in the digital still camera 1300, a video signal output terminal 1312, and an input-output terminal for data communication 1314 are arranged in the side face of the case 1302. Therefore, as illustrated in the drawing, a television monitor 1430 is connected to the video signal output terminal 1312, and a personal computer 1440 is connected to the input-output terminal for data communication 1314, respectively, as necessary. Furthermore, by a predetermined operation, the imaging signal which is stored in the memory 1308 is configured to be output to the television monitor 1430 or the personal computer 1440. The physical quantity sensor 1 which functions as the filter, the resonator, or the like, is built in the digital still camera 1300.

Furthermore, for example, the electronic device including the physical quantity sensor of the invention can be applied to an ink jet type discharge apparatus (for example, ink jet printer), a laptop type personal computer, a television, a video camera, a video tape recorder, a car navigation apparatus, a pager, an electronic organizer (including a communication function), an electronic dictionary, a calculator, an electronic game machine, a word processor, a workstation, a television telephone, a television monitor for security, electronic binoculars, a POS terminal, a medical device (for example, an electronic thermometers, a blood pressure gauge, a blood glucose meter, an electrocardiogram measuring apparatus, an ultrasonic diagnostic apparatus, or an electronic endoscope), a fish finder, various types of measuring devices, instruments (for example, instruments of a vehicle, an airplane, and a ship), a flight simulator, or the like, in addition to the personal computer (mobile type personal computer) of FIG. 11, the cellular phone of FIG. 12, and the digital still camera of FIG. 13.

3. Moving Body

Subsequently, a moving body to which the physical quantity sensor of the invention is applied (moving body of the invention) will be described in detail, based on FIG. 14.

Figure 14:
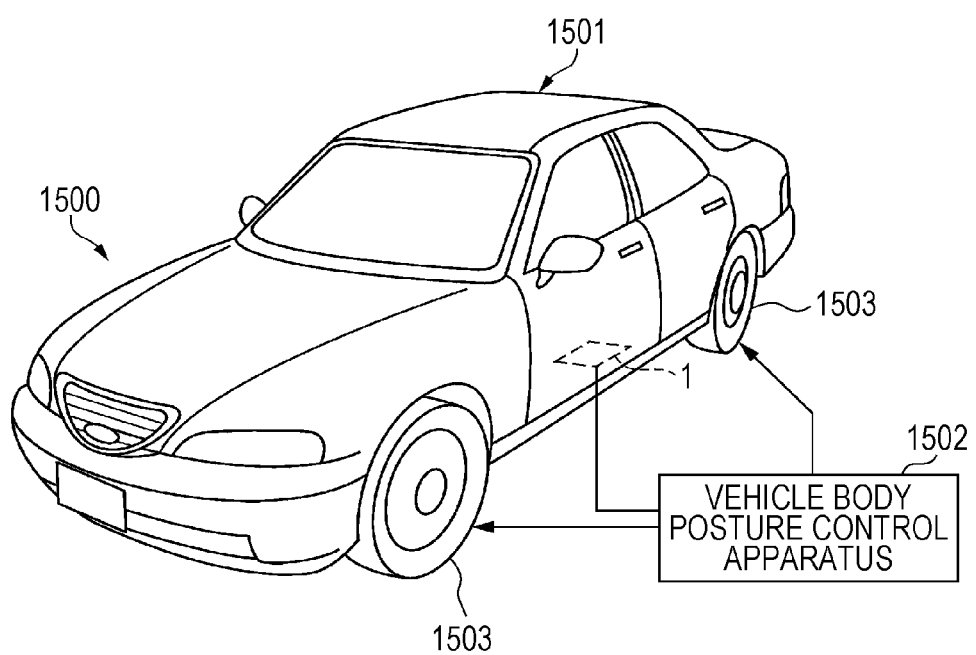
FIG. 14 is a perspective view illustrating an example of a moving body of the invention.

FIG. 14 is a perspective view illustrating a vehicle to which a moving body of the invention is applied. In FIG. 14, a vehicle 1500 includes a vehicle body 1501, and four wheels 1503, and is configured so as to rotate the wheel 1503 by a power source (engine) which is arranged in the vehicle body 1501, and is not illustrated in the drawing.

The physical quantity sensor 1 is built in the vehicle 1500. According to the physical quantity sensor 1, it is possible to detect a posture of the vehicle body 1501 or a moving direction. A detection signal of the physical quantity sensor 1 is supplied to a vehicle body posture control apparatus 1502, and the vehicle body posture control apparatus 1502 detects the position of the vehicle body 1501 on the basis of the signal. The vehicle body posture control apparatus 1502 can control hardness and softness of a suspension depending on a detection result, or can control the brake of the individual wheels 1503.

Furthermore, the moving body including the physical quantity sensor of the invention, is not limited to the vehicle, and for example, may be applied to other vehicles such as a motorcycle or a train, an airplane, a ship, a spaceship, a bipedal walking robot, a radio-controlled helicopter, or the like.

Hitherto, the physical quantity sensor, the method of manufacturing a physical quantity sensor, the electronic device, and the moving body of the invention are described based on the illustrated embodiments, but the invention is not limited thereto. The configuration of each portion can be replaced with a portion of an arbitrary configuration which includes the same function. Moreover, in the invention, other arbitrary configurations may be added. Still more, the respective embodiments may be appropriately combined.

In the embodiments described above, a case of using the acceleration detecting device as an example of the sensor element which is included in the physical quantity sensor of the invention, is described, but the sensor element is not particularly limited, and for example, can be applied to an angular velocity detecting element or the like. Moreover, for example, the sensor elements may be applied to various types of angular velocity detecting elements such as an H-type tuning fork, a two leg tuning fork, a tripod tuning fork and the like.

The entire disclosure of Japanese Patent Application No. 2014-229559, filed Nov. 12, 2014 is expressly incorporated by reference herein.

What is claimed is:

1. A method for manufacturing a physical quantity sensor device, the method comprising:
   preparing a support substrate having a first recess and a first ledge;
   bonding a sensor element on the first ledge of the support substrate so that the sensor element is spaced apart from a bottom of the first recess;
   preparing a seal substrate having a second recess and a second ledge;
   forming a groove in the second ledge of the seal substrate;
   placing a filling material in the groove;
   bonding the first ledge to the second ledge so as to form a bonded body, an inner space of the bonded body being enclosed by only the support substrate and the seal substrate, the filling material being enclosed within the groove by the first ledge; and
   cutting the bonded body through the groove to form the physical quantity sensor device,
   wherein, after cutting, the filling material is externally exposed along only a part of an outer sidewall of the seal substrate, and
   the groove is laterally shifted from the inner space of the bonded body in a plan view.

2. The method according to claim 1,
   wherein the filling material comprises a low melting point glass material.

3. The method according to claim 1,
   wherein the seal substrate comprises a silicon material.

4. The method according to claim 2,
   wherein the seal substrate comprises a silicon material.

5. The method according to claim 1,
   wherein the support substrate comprises a glass material.

6. The method according to claim 2,
   wherein the support substrate comprises a glass material.

7. The method according to claim 3,
   wherein the support substrate comprises a glass material.

8. The method according to claim 4,
   wherein the support substrate comprises a glass material.

* * * * *